(12) United States Patent
Arnaud et al.

(10) Patent No.: US 12,471,382 B2
(45) Date of Patent: Nov. 11, 2025

(54) ESD PROTECTION CIRCUIT

(71) Applicants: STMicroelectronics (Tours) SAS, Tours (FR); STMicroelectronics S.r.l., Agrate Brianza (IT)

(72) Inventors: Aurelie Arnaud, Saint-Cyr-sur-Loire (FR); Andrea Brischetto, Catania (IT)

(73) Assignees: STMicroelectronics (Tours) SAS, Tours (FR); STMicroelectronics S.r.l., Agrate Brianza (IT)

( * ) Notice: Subject to any disclaimer, the term of this patent is extended or adjusted under 35 U.S.C. 154(b) by 466 days.

(21) Appl. No.: 18/052,158

(22) Filed: Nov. 2, 2022

(65) Prior Publication Data
US 2023/0290770 A1    Sep. 14, 2023

Related U.S. Application Data

(62) Division of application No. 16/353,658, filed on Mar. 14, 2019, now Pat. No. 11,515,301.

(30) Foreign Application Priority Data

Mar. 21, 2018    (FR) ...................................... 1852428

(51) Int. Cl.
*H10D 89/00*    (2025.01)
*H10D 8/00*    (2025.01)
*H10D 62/83*    (2025.01)
*H10D 89/60*    (2025.01)

(52) U.S. Cl.
CPC ............... *H10D 89/60* (2025.01); *H10D 8/00* (2025.01); *H10D 62/83* (2025.01); *H10D 89/611* (2025.01)

(58) Field of Classification Search
CPC ........ H10D 89/611; H10D 8/01; H10D 8/022; H10D 8/024
See application file for complete search history.

(56) References Cited

U.S. PATENT DOCUMENTS

| | | | |
|---|---|---|---|
| 10,032,762 | B1 | 7/2018 | Sai |
| 2011/0163352 | A1 | 7/2011 | Gee et al. |
| 2013/0075747 | A1 | 3/2013 | Purtell |
| 2014/0160607 | A1 | 6/2014 | Reimann et al. |
| 2014/0319598 | A1 | 10/2014 | Bobde |
| 2016/0093605 | A1 | 3/2016 | Sai |
| 2016/0141429 | A1* | 5/2016 | Kim .................. H10D 8/25 257/106 |
| 2018/0047718 | A1 | 2/2018 | Yao et al. |
| 2020/0051969 | A1 | 2/2020 | Willemen |

FOREIGN PATENT DOCUMENTS

EP    2 741 330 A1    6/2014

* cited by examiner

*Primary Examiner* — Reema Patel
(74) *Attorney, Agent, or Firm* — Seed IP Law Group LLP

(57) ABSTRACT

An ESD protection circuit includes a terminal connected to the cathode of a first diode and to the anode of a second diode, where the cathode of the second diode is not made of epitaxial silicon.

20 Claims, 2 Drawing Sheets

ESD PROTECTION CIRCUIT

BACKGROUND

Technical Field

The present disclosure relates to electrostatic discharge protection circuits and to methods of manufacturing such a device.

Description of the Related Art

Issues related to electrostatic discharges are all the more present now that electronic circuit components are smaller and smaller and closer and closer to one another. The protection of electronic circuits against electrostatic discharges is a significant challenge to ensure the reliability and the durability of the circuits.

There thus is a permanent need for electrostatic discharge protection circuits having better performance. Specifically, there is a permanent need to better the quality of the protection to satisfy the increasing demands in terms of performance of broadband applications.

BRIEF SUMMARY

An embodiment provides an electrostatic discharge (ESD) protection circuit comprising a terminal connected to the cathode of a first diode and to the anode of a second diode, where the cathode of the second diode is not made of epitaxial silicon.

According to an embodiment, the circuit comprises a second terminal connected to the cathode of a third diode and to the anode of a fourth diode.

According to an embodiment, the cathode of the fourth diode is not made of epitaxial silicon.

According to an embodiment, the anode of the first diode is connected to the anode of a first avalanche diode and the anode of the third diode is connected to the anode of a second avalanche diode.

According to an embodiment, the cathodes of the second and fourth diodes and of the first and second avalanche diodes are connected to a same node.

According to an embodiment, the cathodes of the first and second avalanche diodes comprise N doped epitaxial silicon.

According to an embodiment, the cathodes of the second and fourth diodes are made of bulk silicon.

According to an embodiment, the anodes of the first, second, third, and fourth diodes comprise P doped epitaxial silicon.

Another embodiment provides a method of manufacturing an ESD protection circuit comprising a terminal connected to the cathode of a first diode and to the anode of a second diode, where the cathode of the second diode is not made of epitaxial silicon.

According to an embodiment, the method comprises a step of etching cavities in a semiconductor substrate.

According to an embodiment, the substrate is N doped silicon.

According to an embodiment, the substrate is bulk silicon.

According to an embodiment, the method comprises a step of forming by epitaxy silicon in the cavities.

According to an embodiment, the epitaxial silicon located in each cavity forms the cathode of an avalanche diode.

According to an embodiment, the method comprises forming a diode in series and a diode in parallel with each avalanche diode.

BRIEF DESCRIPTION OF THE SEVERAL VIEWS OF THE DRAWINGS

The foregoing and other features and advantages will be discussed in detail in the following non-limiting description of specific embodiments in connection with the accompanying drawings, among which.

DETAILED DESCRIPTION

Figure 1:
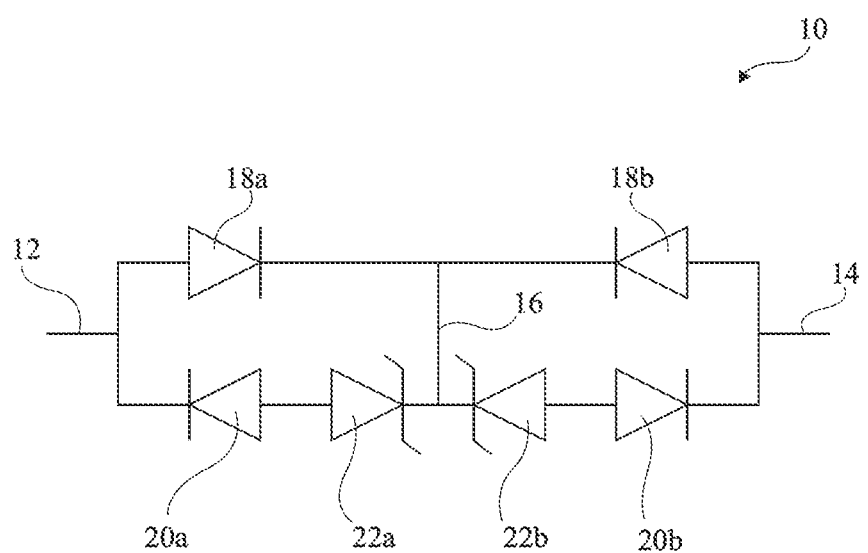
FIG. 1 schematically illustrates an example of an electrostatic discharge protection circuit.

The same elements have been designated with the same reference numerals in the various drawings and, further, the various drawings are not to scale. For clarity, only those steps and elements which are useful to the understanding of the described embodiments have been shown and are detailed. In particular, the systems where the described embodiments can be used are not detailed.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the concerned elements in the drawings. Unless otherwise specified, expressions "approximately", "substantially", and "in the order of" mean to within 10%, preferably to within 5%.

Unless otherwise specified, when reference is made to two elements connected together, this means that the elements are directly connected with no intermediate element other than conductors, and when reference is made to two elements coupled together, this means that the two elements may be directly coupled (connected) or coupled via one or a plurality of other elements.

FIG. 1 schematically illustrates an example of an electrostatic discharge protection circuit 10.

Circuit 10 comprises two nodes or terminals 12 and 14. One of terminals 12 and 14 is for example coupled to ground and the other one is coupled to a contact pad, not shown, which is desired to be protected. Circuit 10 further comprises a central connection node 16.

As a variation, the central node may be coupled to ground and terminals 12 and 14 may be coupled to contact pads, not shown.

Terminal 12 is coupled to node 16 by a diode 18*a* having its anode connected to terminal 12 and having its cathode connected to node 16. Further, terminal 12 is coupled to node 16 by a diode 20*a* in series with an avalanche diode 22*a*. More specifically, the cathode of diode 20*a* is connected to terminal 12 and its anode is connected to the anode of avalanche diode 22*a*. The cathode of avalanche diode 22*a* is connected to node 16. Diode 20*a* and avalanche diode 22*a* are thus in parallel with diode 18*a*, between terminal 12 and node 16.

Similarly, terminal 14 is coupled to node 16 by a diode 18*b* having its anode connected to terminal 14 and having its cathode connected to node 16. Further, terminal 14 is coupled to node 16 by a diode 20*b* in series with an avalanche diode 22*b*. More specifically, the cathode of diode 20*b* is connected to terminal 14 and its anode is connected to the anode of avalanche diode 22*b*. The cathode of avalanche diode 22*b* is connected to node 16. Diode 20 and avalanche diode 22*b* are thus in parallel with diode 18*b*, between terminal 14 and node 16. Avalanche diodes 22a and 22b are for example Zener diodes.

It is for example considered that terminal 14 is coupled to ground and that terminal 12 is coupled to a contact pad.

A positive voltage peak at the level of terminal 12 turns on diode 18a and, if the amplitude of the voltage peak is sufficiently high to cause the avalanche phenomenon in diode 22b, avalanche diode 22b, and diode 20b. The peak is thus dissipated in the ground. A negative voltage peak at the ground causes a similar phenomenon. The voltage peak turns on diode 18b and, if the amplitude of the voltage peak is sufficiently high to cause the avalanche phenomenon in diode 22a, avalanche diode 22a and diode 20a. The voltage peak is thus dissipated by terminal 12. The circuit is thus bidirectional.

The selection of the thresholds of avalanche diodes 22a and 22b enables to select from which amplitude the voltage peak should be dissipated.

Figure 2:
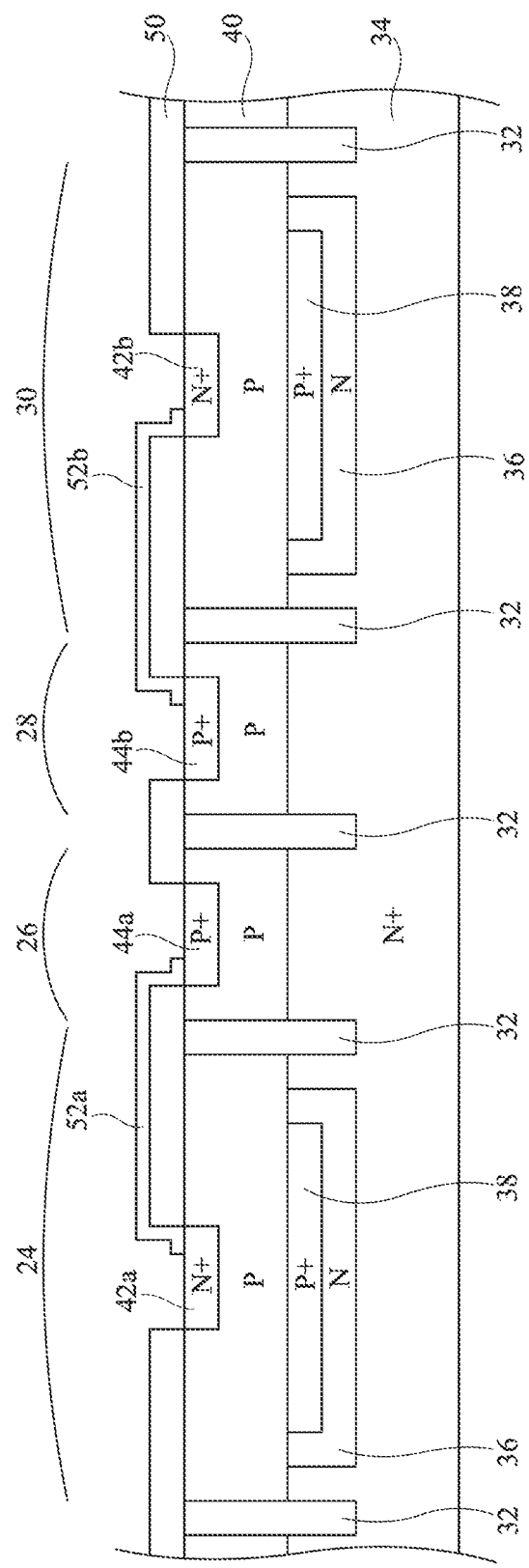
FIG. 2 is a cross-sectional view illustrating an embodiment of the circuit of FIG. 1.

FIG. 2 is a cross-section view illustrating an embodiment of circuit 10 of FIG. 1.

Circuit 10 comprises, from left to right in FIG. 2, an area 24 having avalanche diode 22a (FIG. 1) and diode 20a (FIG. 1) formed therein, an area 26 having diode 18a formed therein (FIG. 1), an area 28 having diode 18b formed therein (FIG. 1) and an area 30 having avalanche diode 22b (FIG. 1) and diode 20b (FIG. 1) formed therein.

The different areas are separated from one another and from neighboring components by insulating wells 32, for example, N doped wells.

Circuit 10 comprises a substrate 34 made of a semiconductor material, for example of silicon. Substrate 34 is N-type doped (N+). Substrate 34 is for example made of bulk silicon.

Substrate 34 contains epitaxial silicon regions 36. The epitaxial silicon of regions 36 is N-type doped. A P doped silicon region 38 (P+) is located in the upper portion in each region 36.

Regions 36 and 38 extend in areas 24 and 30, for example, across more than 90% of their widths. Regions 38 are separated from wells 32 by portions of substrate 34 and/or portions of region 36.

The regions 36 and 38 located in area 24 respectively form the cathode and the anode of avalanche diode 22a. Similarly, the regions 36 and 38 located in area 30 respectively form the cathode and the anode of avalanche diode 22b.

Circuit 10 further comprises a P doped epitaxial silicon layer 40. Layer 40 is located on substrate 34 and on regions 36 and 38. Layer 40 extends over the substrate, at least in areas 24, 26, 28, and 30.

Areas 24 and 30 each comprise, in the upper portion of layer 40, a region 42 (42a in area 24 and 42b in area 30) made of N doped silicon (N+). Regions 42 correspond to the cathode of diode 20a (area 24) and of diode 20b (area 30). The portions of layer 40 located in areas 24 and 30 form the anodes of diode 20a (area 24) and of diode 20b (area 30). The contacts between layer 40 and regions 38 in areas 24 and 30 form the electric connections between the anodes of diodes 20a and 20b and the anodes of avalanche diodes 22a and 22b.

In areas 26 and 28, diodes 18a and 18b are formed by the N doped substrate and P doped layer 40. Areas 26 and 28 for example each comprise, in their upper portion, a P doped (P+) silicon region 44 (44a in area 26 and 44b in area 28), more heavily doped than layer 40, to ease the contacting.

The silicon of the substrate is for example bulk silicon. The cathodes of diodes 18a and 18b thus comprise no epitaxial silicon.

The circuit further comprises, furthermore, an insulator layer 50, for example, made of thermal oxide. Layer 50 comprises openings exposing regions 42 and 44. Layers 52 made of a conductive material, for example a metal, extend on the side of portions of layer 50 to electrically connect each region 42 with a region 44. More particularly, the region 42a of area 24 is connected to the region 44a of area 26 by a layer 52a and the region 42b of area 30 is connected to the region 44b of area 28 by a layer 52b.

Thus, substrate 34 forms node 16, the regions 42 and 44 of areas 24 and 26 for example form terminal 12, and the regions 42 and 44 of areas 28 and 30 for example form terminal 14.

The values of the avalanche thresholds of avalanche diodes 22a and 22b depend on the depths and the resistivity of the regions 36 of areas 24 and 30. For example, regions 36 of areas 24 and 30 have a depth between approximately 5 and approximately 10 μm, and have a resistivity higher than approximately 0.07 Ωm. Regions 36 may have substantially the same dimensions. Avalanche diodes 22a and 22b then have substantially the same avalanche threshold value. Regions 36 may also have different dimensions, more particularly a different depth. The avalanche thresholds of avalanche diodes 22a and 22b are then different and independent from each other.

It is for example considered that terminal 12 (FIG. 1), formed by regions 42a and 44a and layer 52a, is coupled to a contact pad, not shown. It is for example considered that terminal 14 (FIG. 1) formed by regions 42b and 44b and layer 52b is coupled to ground. When a positive voltage peak occurs at the level of terminal 12, for example, when a user touches the contact pad, not shown, the diode of area 26 (18a, FIG. 1, formed by the portion of layer 40 in area 26 and substrate 34) becomes conductive. If the amplitude of the peak is sufficient to trigger the avalanche phenomenon of the avalanche diode of area 30 (22b, FIG. 1, formed by the regions 36 and 38 of area 30), this avalanche diode as well as the diode of area 30 (20b, FIG. 1, formed by the region 42b and the layer 40 of area 30) become conductive. The voltage peak is then dissipated in the ground. Similarly, when a positive voltage peak occurs at the level of terminal 14, the diode of area 28 (18b, FIG. 1, formed by the portion of layer 40 in area 28 and substrate 34) becomes conductive. If the amplitude of the peak is sufficient to trigger the avalanche of the avalanche diode of area 24 (22a, FIG. 1, formed by the regions 36 and 38 of area 24), this avalanche diode, as well as the diode of area 24 (20a, FIG. 1, formed by the region 42a and the layer 40 of area 24), become conductive. The voltage peak is then dissipated by terminal 12.

An example of a method of manufacturing the circuit of FIG. 2 comprises a step of forming first and second cavities at the locations where regions 36 are desired to be formed. Silicon is formed by epitaxy in the cavities to form regions 36. The dimensions, particularly the depth, of the first and second cavities may be substantially equal or different. Regions 38 are then formed in regions 36.

The method further comprises steps of forming layer 40 by epitaxy, of forming regions 42 and 44 in layer 40, of forming insulating wells 32 between the different areas, of forming layer 50, and of forming conductive layers 52. The method also comprises the steps of doping the different regions and layers.

It could have been decided not to form a cavity and to form by epitaxy a silicon layer over the entire substrate 34. Areas 26 and 28 corresponding to diodes 18a and 18b would then have comprised an N doped epitaxial silicon layer, such as areas 24 and 26. However, such an epitaxial silicon layer would cause an increase in the dynamic resistance of diodes 18a and 18b which would then conduct slower and would deteriorate the quality of the protection of the circuit. Further, it would then no longer be possible to select the avalanche thresholds of avalanche diodes 22a and 22b independently from each other. Further, diodes 18a and 18b would then be degraded and would be slower.

Specific embodiments have been described. Various alterations and modifications will occur to those skilled in the art. In particular, the described embodiments also apply to a one-way circuit only comprising a diode 18a or 18b, a diode 20a or 20b, and an avalanche diode 22a or 22b.

Further, insulating wells 32 may be replaced with insulating trenches, for example, made of silicon oxide or of silicon nitride.

Furthermore, the conductivity types of the different described parts can be inverted.

Regions 36 and 38 then extend across the entire width of regions 24 and 30. Regions 36 and 38 may possibly extend outside of insulating trenches 32 delimiting areas 24 and 30. Regions 36 and 38 may possibly extend over a portion, for example less than 30% of areas 26 and 28. This enables to only keep in areas 24 and 30 the most heavily doped or the less damaged portions of regions 36 and 38.

As a variation, if areas 26 and 28 are desired to be insulated from the portions of the regions 36 and 38 extending outside of areas 24 and 30, it is possible to form insulating trenches 32 between areas 26 and 28 and regions 36 and 38. The area between areas 24 and 26 and that between areas 28 and 30 are then covered with insulator layer 50 and conductive layer 52.

Various embodiments with different variations have been described hereinabove. It should be noted that those skilled in the art may combine various elements of these various embodiments and variations without showing any inventive step.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
forming a first cavity and a second cavity in an upper surface of a semiconductor substrate;
forming a first epitaxial silicon region in the first cavity and a second epitaxial silicon region in a second cavity, each of the first and second epitaxial regions having an upper surface;
forming a first doped silicon region in the upper surface of the first epitaxial silicon region and a second doped silicon region in the upper surface of the second epitaxial silicon region, each of the first and second doped silicon regions having an upper surface;
forming an epitaxial layer on the upper surface of the semiconductor substrate, on the upper surfaces of the first and second epitaxial silicon regions, and on the upper surfaces of the first and second doped silicon regions, the epitaxial layer having an upper surface;
forming a third doped silicon region and a fourth doped silicon region in the upper surface of the epitaxial layer, the third doped silicon region being over the first epitaxial silicon region and the fourth doped silicon region being over the second epitaxial silicon region; and
forming, in the upper surface of a portion of the epitaxial layer over a portion of the semiconductor substrate between the first and second cavities, a fifth doped silicon region and a sixth doped silicon region.

2. The method of claim 1, further comprising:
forming a first conductive layer over the epitaxial layer and extending between the third doped silicon region and the fifth doped silicon region; and
forming a second conductive layer over the epitaxial layer and extending between the fourth doped silicon region and the sixth doped silicon region.

3. The method of claim 1, further comprising forming first and second insulating wells extending, from the upper surface of the epitaxial layer in the portion of the epitaxial layer over the portion of the substrate between the first and second cavities, through the epitaxial layer and into the substrate between the first and second cavities.

4. The method of claim 3 further comprising forming a third insulating well between the first and second insulating wells, the third insulating well extending from the upper surface of the epitaxial layer between the fifth doped silicon region and the fifth doped silicon region through the epitaxial layer and into the substrate between the first and second cavities.

5. The method of claim 1, further comprising forming an insulating layer on the epitaxial layer.

6. The method of claim 1, wherein the epitaxial layer comprises a P doped epitaxial layer.

7. The method of claim 6, wherein the semiconductor substrate comprises an N doped silicon substrate.

8. A structure, comprising:
a substrate;
a first cavity and a second cavity in an upper surface of the substrate;
a first epitaxial silicon region in the first cavity and a second epitaxial silicon region in the second cavity, each of the first and second epitaxial regions having an upper surface;
a first doped silicon region in the upper surface of the first epitaxial silicon region and a second doped silicon region in the upper surface of the second epitaxial silicon region, each of the first and second doped silicon regions having an upper surface;
an epitaxial layer on the upper surface of the substrate and on the upper surfaces of the first and second epitaxial silicon regions and the first and second doped silicon regions, the epitaxial layer having an upper surface;
third doped silicon region and fourth doped silicon region in the upper surface of the epitaxial layer, the third doped silicon region over the first epitaxial silicon region, the fourth doped silicon region over the second epitaxial silicon regions; and
fifth and sixth doped silicon regions in a portion of the upper surface of the epitaxial layer and over a portion of the substrate between the first and second cavities.

9. The structure of claim 8, further comprising:
a first conductive layer over the epitaxial layer and extending between the third doped silicon region and fifth doped silicon region; and a second conductive layer over the epitaxial layer and extending between the fourth doped silicon region and sixth doped silicon region.

10. The structure of claim 8, further comprising first and second insulating wells each extending from the upper surface of the epitaxial layer in the portion of the epitaxial layer over the portion of the substrate between the first and second cavities, through the epitaxial layer, into the substrate between the first and second cavities.

11. The structure of claim 10, further comprising a third insulating well between the first and second insulating wells, the third insulating well extending from the upper surface of the epitaxial layer between the fifth and sixth doped silicon regions through the epitaxial layer and into the substrate between the first and second cavities.

12. The structure of claim 8, further comprising an insulating layer on the epitaxial layer.

13. The structure of claim 8 wherein the epitaxial layer includes a P doped epitaxial layer.

14. The structure of claim 8, wherein the substrate include an N doped silicon substrate.

15. A method, comprising:
    forming a first cavity and a second cavity in an upper surface of a substrate;
    forming a first epitaxial silicon region in the first cavity and a second epitaxial silicon region in the second cavity, each of the first and second epitaxial regions having an upper surface;
    forming a first doped silicon region in the upper surface of the first epitaxial silicon region and a second doped silicon region in the upper surface of the second epitaxial silicon region, each of the first and second doped silicon regions having an upper surface;
    forming an epitaxial layer on the upper surface of the substrate and on the upper surfaces of the first and second epitaxial silicon regions and the first and second doped silicon regions, the epitaxial layer having an upper surface;
    forming third doped silicon region and fourth doped silicon region in the upper surface of the epitaxial layer, the third doped silicon region over the first epitaxial silicon region, the fourth doped silicon region over the second epitaxial silicon regions; and
    forming fifth and sixth doped silicon regions in a portion of the upper surface of the epitaxial layer and over a portion of the substrate between the first and second cavities.

16. The method of claim 15, further comprising:
    forming a first conductive layer over the epitaxial layer and extending between the third doped silicon region and fifth doped silicon region; and
    forming a second conductive layer over the epitaxial layer and extending between the fourth doped silicon region and sixth doped silicon region.

17. The method of claim 15, further comprising forming first and second insulating wells each extending from the upper surface of the epitaxial layer in the portion of the epitaxial layer over the portion of the substrate between the first and second cavities, through the epitaxial layer, into the substrate between the first and second cavities.

18. The method of claim 17, further comprising forming a third insulating well between the first and second insulating wells, the third insulating well extending from the upper surface of the epitaxial layer between the fifth and sixth doped silicon regions through the epitaxial layer and into the substrate between the first and second cavities.

19. The method of claim 15, further comprising forming an insulating layer on the epitaxial layer.

20. The method of claim 17, wherein the first and second insulating wells each terminate within the substrate.

* * * * *